(12) United States Patent
Wang (10) Patent No.: US 8,368,480 B2
(45) Date of Patent: Feb. 5, 2013

(54) PHASE LOCKED LOOP CIRCUITS AND GAIN CALIBRATION METHODS THEREOF

(75) Inventor: Ping-Ying Wang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 103 days.

(21) Appl. No.: 12/490,851

(22) Filed: Jun. 24, 2009

(65) Prior Publication Data

US 2010/0327984 A1    Dec. 30, 2010

(51) Int. Cl.
*H03L 5/00* (2006.01)

(52) U.S. Cl. .............. 331/182; 331/16; 331/17; 331/23; 331/25; 331/34; 331/172; 331/177 V; 375/376

(58) Field of Classification Search ............... 331/16, 331/17, 23, 25, 34, 172, 177 V, 182; 375/376
See application file for complete search history.

(56) References Cited

U.S. PATENT DOCUMENTS

| | | | |
|---|---|---|---|
| 5,739,709 A | 4/1998 | Banno | |
| 5,942,949 A * | 8/1999 | Wilson et al. | 331/17 |
| 6,614,316 B2 | 9/2003 | Masenas et al. | |
| 6,788,154 B2 | 9/2004 | Maneatis | |
| 7,095,287 B2 | 8/2006 | Maxim et al. | |
| 7,265,635 B2 * | 9/2007 | Meltzer | 331/16 |
| 7,312,663 B2 * | 12/2007 | Abel | 331/16 |
| 2003/0128074 A1 | 7/2003 | Maxim et al. | |
| 2005/0111605 A1 | 5/2005 | Loke et al. | |
| 2008/0008284 A1 * | 1/2008 | Huang et al. | 375/376 |
| 2008/0036543 A1 * | 2/2008 | Bazes | 331/8 |
| 2008/0198959 A1 | 8/2008 | Hasegawa | |
| 2009/0207961 A1 * | 8/2009 | Sai | 375/375 |

OTHER PUBLICATIONS

Wang, P.Y., et al.; "An Analog Enhanced All Digital RF Fractional-F PLL with Self-Calibrated Capability;" IEEE Custom Integrated Circuits Conference; 2008; pp. 749-752.
Wang, P.Y., et al.; "A Fractional Spur Reduction Technique for RF TDC-Based All Digital PLLs;" IEEE; 2008; pp. 422-425.

* cited by examiner

*Primary Examiner* — Arnold Kinkead
*Assistant Examiner* — Richard Tan
(74) *Attorney, Agent, or Firm* — McClure, Qualey & Rodack, LLP (57) ABSTRACT

Phase locked loop circuits are provided, in which a phase locked loop module includes a voltage controlled oscillator to generate an oscillation signal with an output frequency according to a control voltage, and a gain calibration module triggers the phase locked loop module to induce a frequency variation characterized by a delta function in the output frequency and calculates a gain of the voltage controlled oscillator according to a phase error caused by the frequency variation in the output frequency.

20 Claims, 10 Drawing Sheets

PHASE LOCKED LOOP CIRCUITS AND GAIN CALIBRATION METHODS THEREOF

BACKGROUND OF THE INVENTION

1. Field of the Invention

The invention relates to phase locked loop circuits, and more particularly, to phase locked loop circuits capable of calibrating a gain of a voltage controlled oscillator.

2. Description of the Related Art

Many different types of integrated circuits and non-integrated circuits employ clock generating circuits such as phase locked loop circuits. Some examples of integrated circuits employing phase locked loop circuits include, but are not limited to, graphics processors, central processing units, measurement processors, microprocessors, and communication processors or any other suitable integrated circuits that employ clock generators. Manufacturing process variations, voltage supply variations and variations due to temperature changes, may cause a phase locked loop to go out of phase, thereby causing clocked data to be lost. Although phase locked loop circuits employ a feedback structure that can adjust, to some degree, phase variations, for wide frequency phase variation ranges, the feedback structure adjustment is unsatisfactory. For conventional voltage controlled oscillator calibration methods, gains of the phase locked loop circuits are detected by an offline calibration. For example, the phase locked loop circuits are required to switch to an open loop from a closed loop to perform gain detection steps. However, a phase locked loop may go out of phase when the phase locked loop is operated in an open loop during the offline calibration. Hence, in such a case, the gain of the phase locked loop is not detected and calibrated when a system is online. Accordingly, there is a need for an online gain calibration method for a phase locked loop circuit.

BRIEF SUMMARY OF THE INVENTION

Embodiments of a phase locked loop circuit are provided, in which a phase locked loop module comprises a voltage controlled oscillator to generate an oscillation signal with an output frequency according to a control voltage, and a gain calibration module triggers the phase locked loop module to induce a frequency variation characterized by a delta function in the output frequency and calculates a gain of the voltage controlled oscillator according to a phase error caused by the frequency variation in the output frequency.

The invention also provides another embodiment of a phase locked loop circuit, in which a phase locked loop module comprises a phase frequency divider, a charge pump circuit, a loop filter and a voltage controlled oscillator and generates an oscillation signal with an output frequency. A gain calibration module triggers the phase locked loop module to induce a frequency variation characterized by a delta function in the output frequency and calculates a gain of the voltage controlled oscillator according to a phase error caused by the frequency variation characterized by a delta function in the output frequency, when the phase locked loop module is operated under a closed loop.

The invention also provides an embodiment of a gain calibration method, in which a phase locked loop module is triggered to induce a frequency variation characterized by a delta function in the output frequency of an oscillation signal thereof, a phase error caused by the frequency variation is detected, and a gain of a voltage controlled oscillator in the phase locked loop module is calculated according to the phase error.

BRIEF DESCRIPTION OF THE DRAWINGS

The invention can be more fully understood by reading the subsequent detailed description and examples with references made to the accompanying drawings, wherein:

FIGS. 4A-1~4A-3 and 4B-1~4B-3 are respectively schematic diagrams of a linear phase correction unit (LPCU) according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and claims to refer to particular system components. As one skilled in the art will appreciate, consumer electronic equipment manufacturers may refer to a component by different names. This document does not intend to distinguish between components that differ in name but not function.

In order to calibrate a phase locked loop circuit without affecting its performance, embodiments of the invention induce a frequency variation characterized by a delta function $\delta(t)$ for generating output of the phase locked loop circuit to serve as a test signal. In addition, the embodiments further calculate a gain of a voltage controlled oscillator in the phase locked loop circuit according to a phase error caused by the test signal for subsequently calibration steps. For example, when a test signal $\theta_{test}(t)$ is applied to the output of the voltage controlled oscillator, the output of the voltage controlled oscillator can be represented as $\cos(\omega_{vco} \cdot t + \theta_{test}(t)) = \cos(\omega_{vco} \cdot t) \cdot \sin(\theta_{test}(t)) + \sin(\omega_{vco} \cdot t) \cdot \cos(\theta_{test}(t))$. Because the test signal $\theta_{test}(t)$ must be a small signal, the output of the voltage controlled oscillator can be represented as $\cos(\omega_{vco}\cdot t+\theta_{test}(t))$ $=\cos(\omega_{vco}\cdot t)\cdot\sin(\theta_{test}(t))+\sin(\omega_{vco}\cdot t)$. The Fourier Transfer Function of the equation is $F(\cos(\omega_{vco}\cdot t))\otimes F(\theta_{test}(t))+F(\sin(\omega_{vco}\cdot t))$. Because the test signal $\theta_{test}(t)$ is a frequency variation characterized by the delta function $\delta(t)$, $F(\theta_{test}(t))=F(\delta(t))=1$ and thus, the Fourier Transfer Function of the equation can be rewritten as $F(\cos(\omega_{vco}\cdot t))+F(\sin(\omega_{vco}\cdot t))$, in which $F(\cos(\omega_{vco}\cdot t))$ represents the desired signal, and $F(\sin(\omega_{vco}\cdot t))$ represents the image of the desired signal. Namely, the spectrum of the test signal $\theta_{test}(t)$ is a white-noise, and thus, the performance of the phase locked loop circuit is not influenced by the test signal $\theta_{test}(t)$ during calibration.

Figure 1:
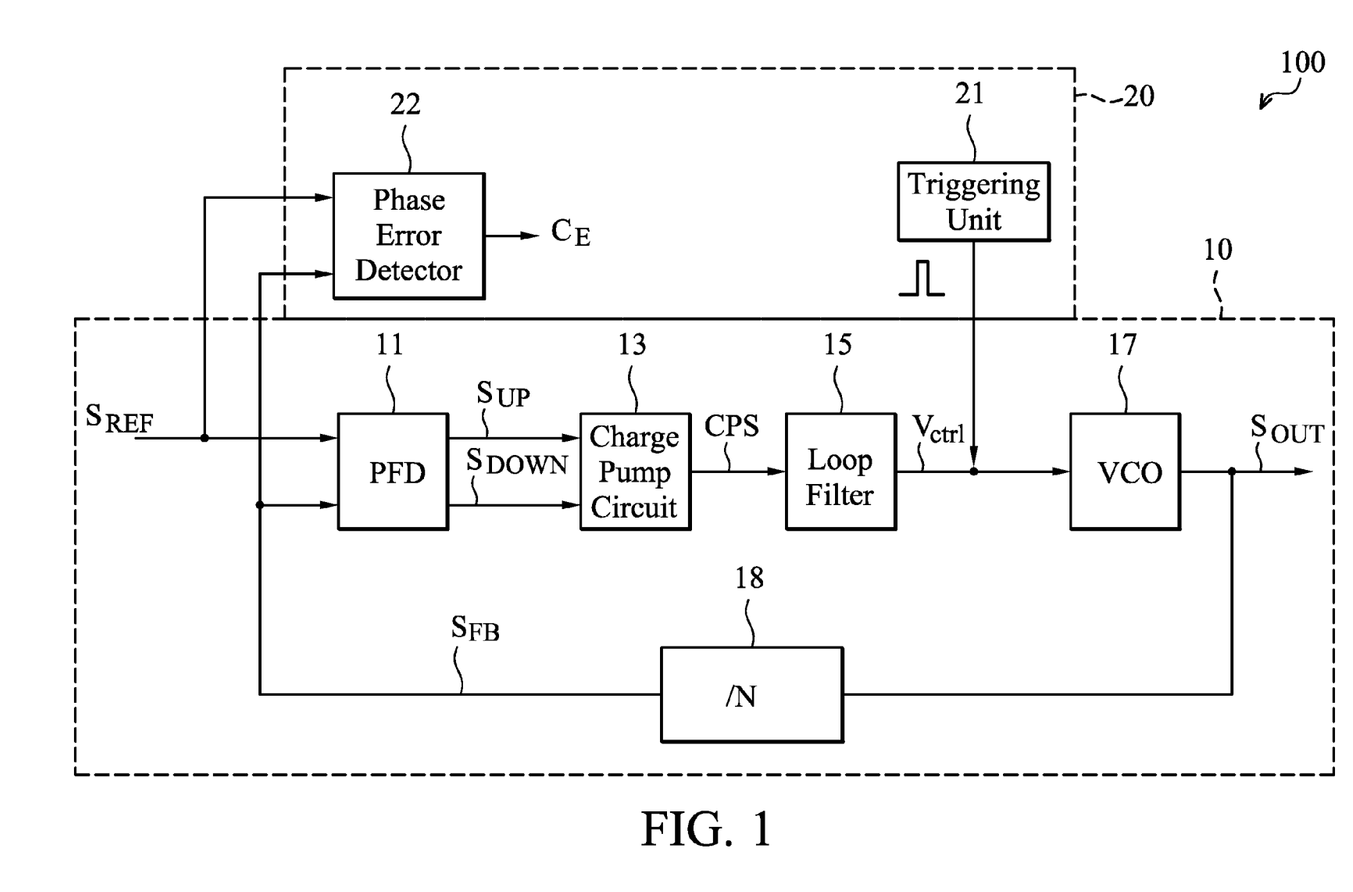
FIG. 1 shows an embodiment of a phase locked loop circuit.

FIG. 1 shows an embodiment of a phase locked loop circuit. As shown, the phase locked loop circuit 100 comprises a phase locked loop module 10 and a gain calibration module 20. The phase locked loop module 10 comprises a phase frequency detector 11, a charge pump circuit 13, a loop filter 15, a voltage controlled oscillator (VCO) 17 and a frequency divider 18. The phase frequency detector 11 compares the phase and/or frequency differences of a reference signal $S_{REF}$ (with a reference frequency) and a divided oscillation signal $S_{FB}$ from the frequency divider 18. Based on the differences, the phase frequency detector 11 generates an up signal $S_{UP}$ and/or a down signal $S_{DOWN}$. The up signal $S_{UP}$ causes the charge pump circuit 13 to source a larger amount of current to the loop filter 15 (e.g., provide more positive current pulses) and the down signal $S_{DOWN}$ causes the charge pump circuit 13 to sink more current from the loop filter 15 (e.g., provide more negative current pulses). As such, the current signal (i.e., charge pump signal CPS) produced by the charge pump circuit 13 either sources current to or sinks current from the loop filter. The loop filter 15 translates the current signal (i.e. the charge pump signal CPS) from the charge pump circuit 13 into a control voltage $V_{ctrl}$. The VCO 17 then translates the control voltage $V_{ctrl}$ into an oscillation signal $S_{OUT}$ with an output frequency $f_{VCO}$, based on the gain ($K_{VCO}$) of the VCO 17. The frequency divider 18 divides the oscillation signal $S_{OUT}$ to generate the divided oscillation signal $S_{FB}$.

The gain calibration module 20 triggers the phase locked loop module 10 to induce a frequency variation $\Delta f$ characterized by the delta function in the output frequency $f_{VCO}$, and calculates a gain of the VCO 17 according to a phase error caused by the frequency variation $\Delta f$ characterized by the delta function in the output frequency $f_{VCO}$. The gain calibration module 20 comprises a triggering unit 21 and a phase error detector 22. The triggering unit 21 provides a pulse to trigger the phase locked loop module 10 to induce the frequency variation $\Delta f$ characterized by the delta function in the output frequency $f_{VCO}$. Examples that illustrate the triggering unit 21 triggering the phase locked loop module 10 to induce the frequency variation $\Delta f$ characterized by the delta function in the output frequency $f_{VCO}$ are discussed hereinafter.

EXAMPLE 1

Figure 2A:
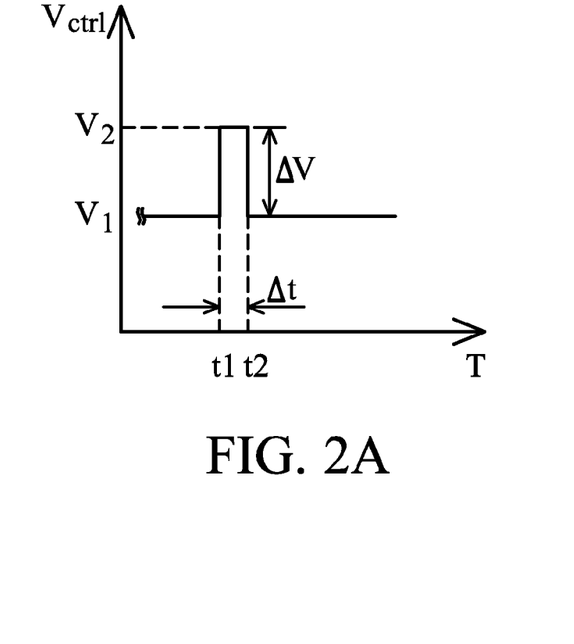
FIG. 2A is a diagram showing voltage variation caused by the gain calibration module according to an embodiment of the invention.
Figure 2B:
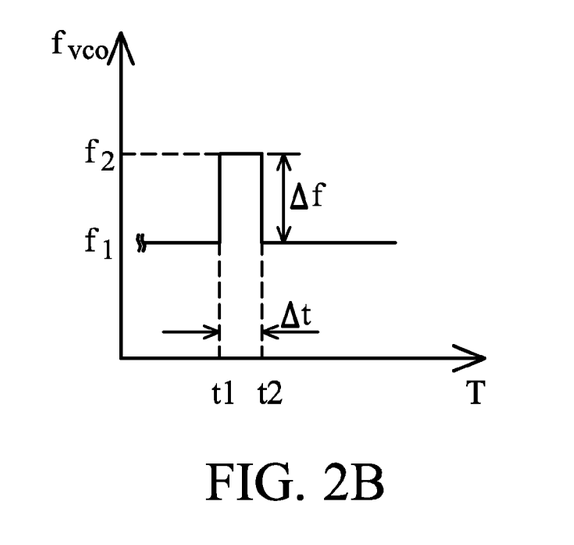
FIG. 2B is a diagram showing the frequency variation characterized by a delta function caused by the voltage variation shown in FIG. 2A.

The triggering unit 21 increases the control voltage $V_{ctrl}$ by a predetermined voltage variation $\Delta V$ for a predetermined time interval $\Delta t$. As shown in FIG. 2A, the control voltage $V_{ctrl}$ is sharply increased to voltage $V_2$ from $V_1$ by the predetermined voltage variation $\Delta V$ at time $t_1$, and the control voltage $V_{ctrl}$ is sharply decreased to voltage $V_1$ from $V_2$ at time $t_2$ after the predetermined time interval $\Delta t$ passes. From $\Delta f=\Delta V\times K_{VCO}$, it is shown that the output frequency $f_{VCO}$ is sharply increased to frequency $f_2$ from $f_1$ as the control voltage $V_{ctrl}$ is sharply increased to voltage $V_2$ from $V_1$ by the predetermined voltage variation $\Delta V$ at time $t_1$. Then, after the predetermined time interval passes, the output frequency is decreased to frequency $f_1$ from $f_2$ as the control voltage $V_{ctrl}$ is sharply decreased to voltage $V_1$ from $V_2$ at time $t_2$. Namely, the triggering unit 21 induces the voltage variation $\Delta V$ characterized by a delta function on the control voltage $V_{ctrl}$ as shown in FIG. 2A (i.e., applies a pulse characterized by a delta function) to trigger the phase locked loop module 10 to induce the frequency variation $\Delta f$ characterized by the delta function in the output frequency $f_{VCO}$ as shown in FIG. 2B.

EXAMPLE 2

Figure 2C:
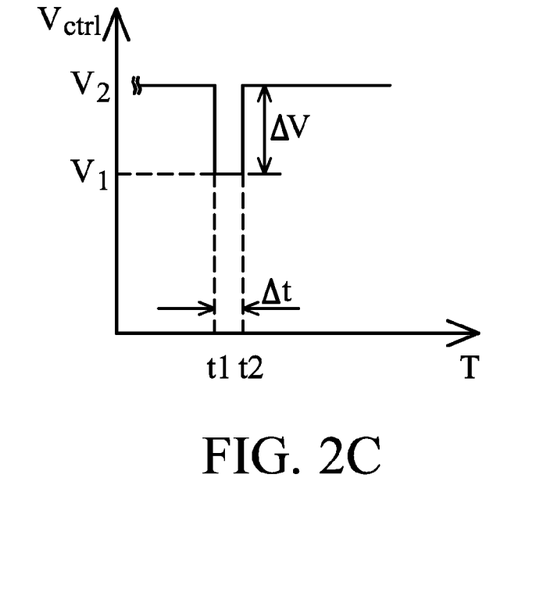
FIG. 2C is a diagram showing voltage variation caused by the gain calibration module according to another embodiment of the invention.
Figure 2D:
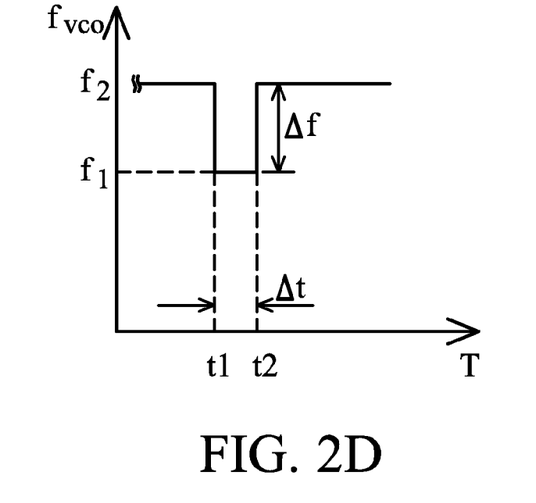
FIG. 2D is a diagram showing the frequency variation characterized by a delta function caused by the voltage variation shown in FIG. 2C.

The triggering unit 21 decreases the control voltage $V_{ctrl}$ by a predetermined voltage variation $\Delta V$ for a predetermined time interval $\Delta t$. As shown in FIG. 2C, the control voltage $V_{ctrl}$ is sharply decreased to voltage $V_1$ from $V_2$ by the predetermined voltage variation $\Delta V$ at time $t_1$, and the control voltage $V_{ctrl}$ is sharply increased to voltage $V_2$ from $V_1$ at time $t_2$ after the predetermined time interval $\Delta t$ passes. Similarly, from $\Delta f=\Delta V\times K_{VCO}$, the output frequency fVCO is sharply decreased to frequency $f_1$ from $f_2$ as the control voltage $V_{ctrl}$ is sharply decreased to voltage $V_1$ from $V_2$ by the predetermined voltage variation $\Delta V$ at time $t_1$, and then, after the predetermined time interval passes, the output frequency $f_{VCO}$ is increased to frequency $f_2$ from $f_1$ as the control voltage $V_{ctrl}$ is sharply increased to voltage $V_2$ from $V_1$ at time $t_2$. Namely, the triggering unit 21 induces the voltage variation $\Delta V$ characterized by the delta function on the control voltage $V_{ctrl}$ as shown in FIG. 2C (i.e., applies a pulse characterized by a delta function) to trigger the phase locked loop module 10 to induce the frequency variation $\Delta f$ characterized by the delta function in the output frequency $f_{VCO}$ as shown in FIG. 2D.

The phase error detector 22 compares a phase of the reference signal $S_{REF}$ and a phase of the divided oscillation signal $S_{FB}$ to obtain a phase error $\theta_e$ caused by the frequency variation $\Delta f$ characterized by the delta function. The phase error detector 22, for example, can be a time to digital converter (TDC) for converting the phase error $\theta_e$ caused by the frequency variation $\Delta f$ characterized by the delta function into a digital code $C_E$. The digital code $C_E$ is output to a control unit (not shown) in the gain calibration module 20, and then the control unit calculates and calibrates the gain $K_{VCO}$ of the VCO according to the digital code $C_E$. For example, from $\theta_e=\Delta f\times\Delta t$ and $\Delta f=\Delta V\times K_{VCO}$, the phase error $\theta_e$ can be rewritten as $\theta_e=\Delta V\times K_{VCO}\times\Delta t$. In the embodiment, because the predetermined voltage variation $\Delta V$ and the predetermined time interval $\Delta t$ are applied by the triggering unit 21 and the phase error $\theta_e$ is measured by the phase error detector 22, the gain of the VCO 17 can be accurately calculated and calibrated.

It should noted that because the spectrum of the frequency variation $\Delta f$ characterized by the delta function is a white-noise, the performance of the phase locked loop module 10 is not influenced by the frequency variation $\Delta f$ characterized by the delta function, and thus, the gain calibration module 20 can trigger the phase locked loop module 10 to induce the frequency variation $\Delta f$ characterized by the delta function in the output frequency $f_{VCO}$ and calculate the gain $K_{VCO}$ of the VCO 17 when the phase locked loop module 10 is operated under a closed loop.

Figure 3:
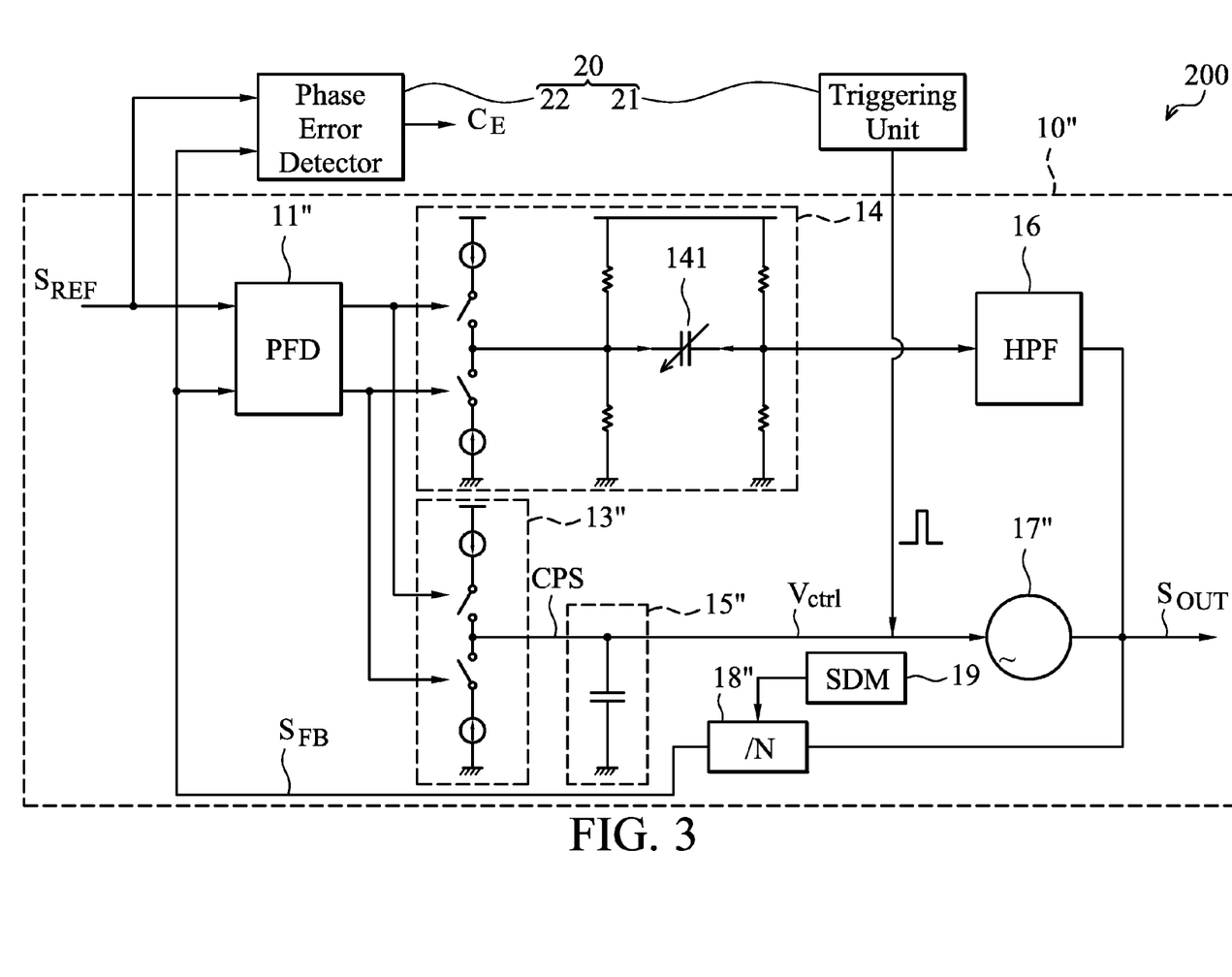
FIG. 3 shows another embodiment of a phase locked loop circuit.

FIG. 3 shows another embodiment of the phase locked loop circuit. As shown, the phase locked loop circuit 200 comprises a phase locked loop module 10" and the gain calibration module 20 as shown in FIG. 1. The phase locked loop module 10" comprises an integral path composed of a phase frequency detector 11", a charge pump circuit 13", a loop filter 15" and a VCO 17", a frequency divider 18", a sigma delta modulator 19 and a proportional path composed of the phase frequency detector 11", a linear phase correction unit (LPCU) 14 and a high pass filter 16. Operations of the analog frequency correction path formed by the phase frequency detector 11", the charge pump circuit 13", the loop filter 15" and the VCO 17" are similar to that of the same elements shown in FIG. 1, and thus, are omitted for brevity. Preferably, the high pass filter 16 is an AC coupling capacitor for filtering transient ripples.

Figure 4A:
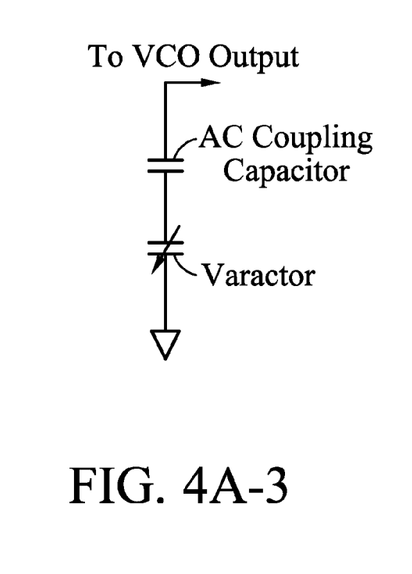
Figure 4A:
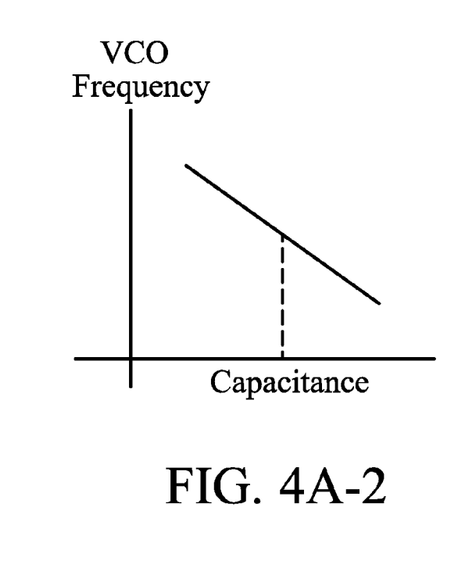
Figure 4A:
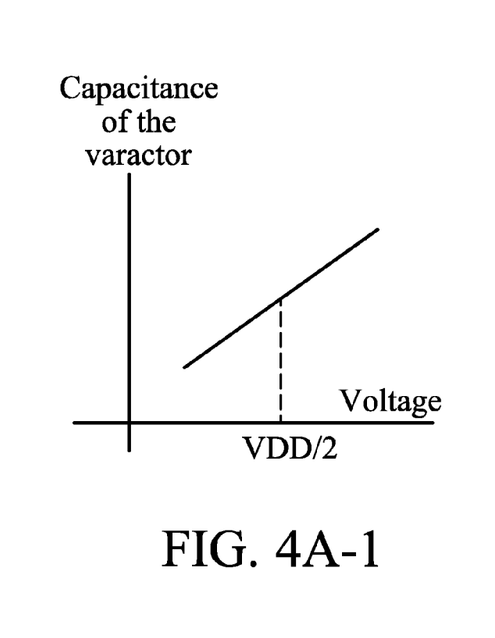
Figures 4B, 4B, 4B:
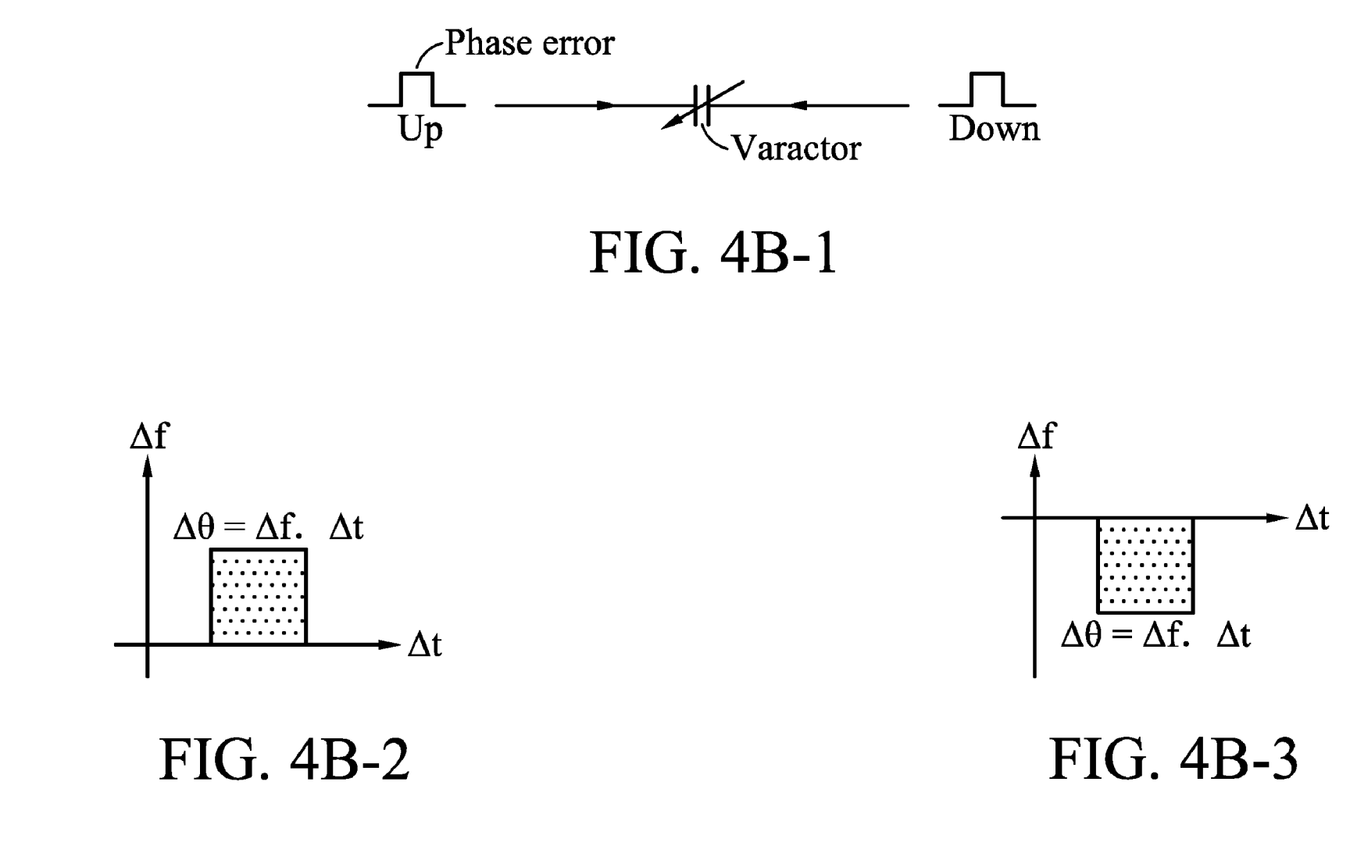

FIGS. 4A-1~4A-3 and 4B-1~4B-3 are respectively schematic diagrams of a linear phase correction unit (LPCU) according to an embodiment of the invention. The LPCU 14 of FIG. 3 uses a phase error signal (i.e., the up signal $S_{UP}$ and/or the down signal $S_{DOWN}$) generated by the phase frequency detector 11" having a pulse width proportional to the phase error, to change the capacitance of the varactor 141 by controlling the voltage on the varactor 141. The relationship between frequency, capacitance and control voltage of the LPCU 14 are shown in FIGS. 4A-1~4A-3. For example, as shown in FIG. 4A-1, the capacitance of the varactor 141 is in direct proportion to the control voltage of the varactor 141. From $$f = \frac{1}{2\pi\sqrt{LC}},$$

it is seen that frequency is in inverse ratio to capacitance. Hence, as shown in FIG. 4A-2, the relationship between the output frequency $f_{VCO}$ of the phase locked loop module 10 is substantially in inverse ratio to and the capacitance of the varactor 141. As shown in FIG. 4A-3, the varactor 141 is coupled to the output of VCO 17 through AC coupling capacitor for filtering transient ripples (i.e., the high pass filter 16), such that the output frequency $f_{VCO}$ of the phase locked loop module 10 can be adjusted according to the phase error signal generated by the phase frequency detector 11". The phase correction is linearly proportional to the phase error because the frequency change of VCO 17 is linearly proportional to capacitance change as shown in FIGS. 4B-1~4B-3. As shown in FIG. 4B-2, the LPCU 14 increases the output frequency $f_{VCO}$ for phase compensation according to a phase error signal generated by the phase frequency detector 11", when phase error signal generated by the phase frequency detector 11" is the up signal. On the contrary, when phase error signal is the down signal, the LPCU 14 generates a phase correction which is linearly proportional to the phase error to decrease the output frequency $f_{VCO}$ for compensation, as shown in FIG. 4B-3.

Similarly, the triggering unit 21 increases/decreases the control voltage $V_{ctrl}$ by a predetermined voltage variation $\Delta V$ for a predetermined time interval $\Delta t$ to trigger the phase locked loop module 10 to induce a frequency variation $\Delta f$ characterized by the delta function in the output frequency $f_{VCO}$. Examples that illustrate the triggering unit 21 triggering the phase locked loop module 10 to induce the frequency variation $\Delta f$ characterized by the delta function in the output frequency $f_{VCO}$ are discussed above, and thus are omitted for brevity.

The phase error detector 22 compares a phase of the reference signal $S_{REF}$ and a phase of the divided oscillation signal $S_{FB}$ to obtain a phase error $\theta_e$ caused by the frequency variation $\Delta f$ characterized by the delta function. The phase error detector 22 converts the phase error $\theta_e$ caused by the frequency variation $\Delta f$ characterized by the delta function into a digital code $C_E$. The digital code $C_E$ is output to a control unit (not shown), and then the control unit calculates and calibrates the gain $K_{VCO}$ of the VCO 17" according to the digital code $C_E$ as discussed above. For example, the control unit controls the sigma delta modulator 19 to calibrate the gain $K_{VCO}$ of the VCO 17", but is not limited thereto.

Because the spectrum of the frequency variation $\Delta f$ characterized by the delta function is a white-noise, the performance of the phase locked loop module 10" is not influenced by the frequency variation $\Delta f$ characterized by the delta function, and thus, the gain calibration module 20 can trigger the phase locked loop module 10" to induce the frequency variation $\Delta f$ characterized by the delta function in the output frequency $f_{VCO}$ and calculate the gain $K_{VCO}$ of the VCO 17" when the phase locked loop module 10" is operated under a closed loop.

Figure 5:
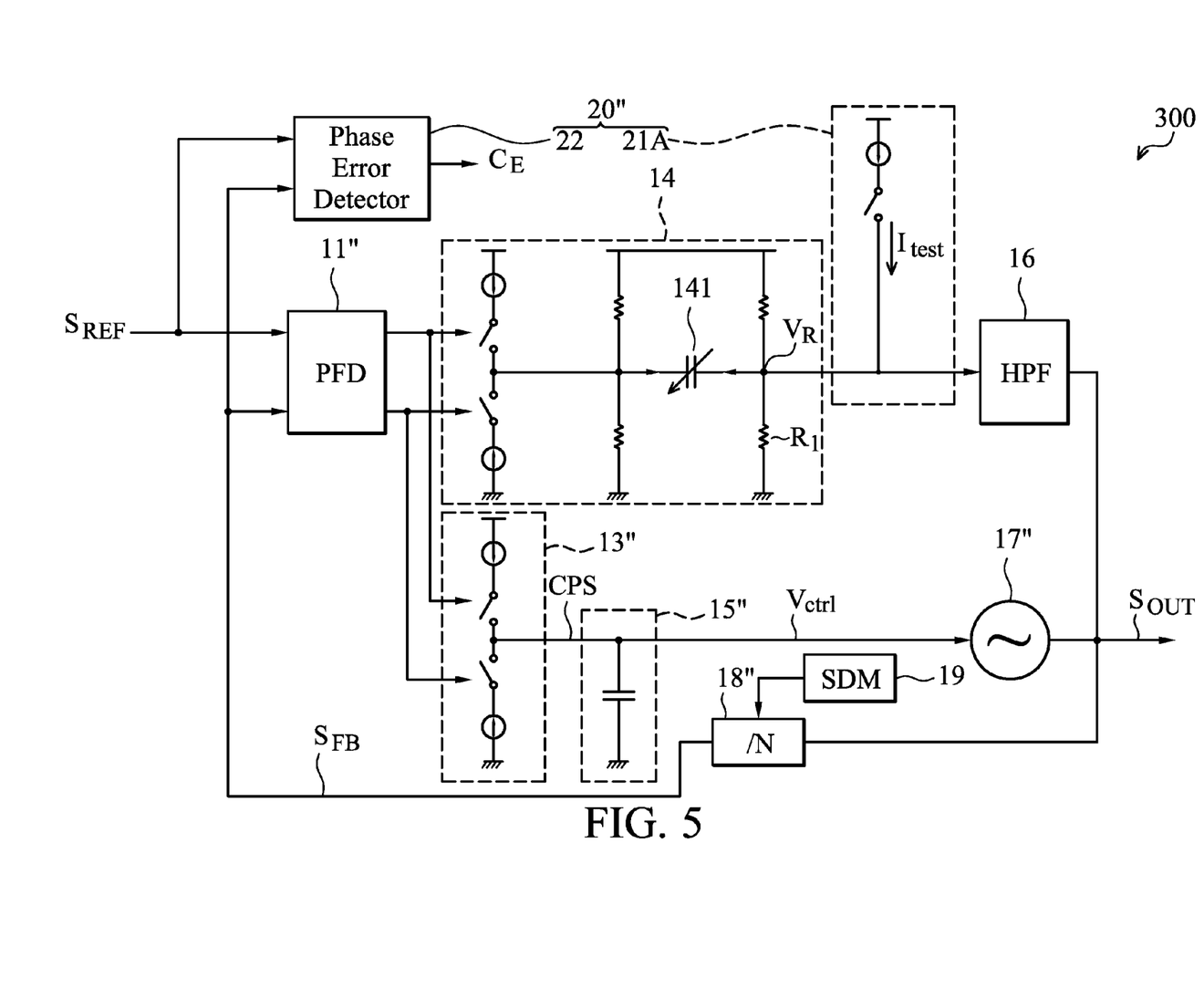
FIG. 5 shows another embodiment of a phase locked loop circuit.

FIG. 5 shows another embodiment of the phase locked loop circuit 300 differing from the phase locked loop circuit 200 shown in FIG. 3 in that the triggering unit 21A triggers the LPCU 14 to induce the frequency variation $\Delta f$ characterized by the delta function in the output frequency $f_{VCO}$ rather than adjusting the control voltage $V_{ctrl}$ of the VCO 17".

Figure 6A:
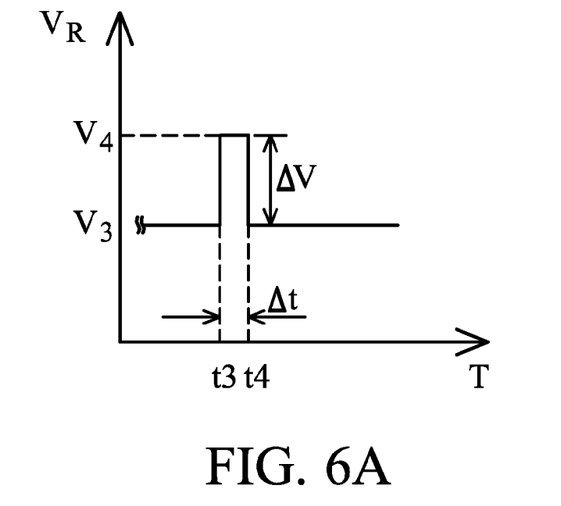
FIG. 6A is a diagram showing voltage variation caused by the triggering unit according to an embodiment of the invention.

For example, the triggering unit 21A injects an accurate test current Itest mirrored from a band-gap reference with a ratio to the resistor R1 for a predetermined time interval $\Delta t$. As shown in FIG. 6A, the voltage VR in the LPCU 14 is sharply increased to voltage V4 from V3 when the current Itest is injected to the resistor R1 at time t3, and after the predetermined time interval $\Delta t$ passes, the voltage VR is sharply decreased to voltage V3 from V4 when the triggering unit stops injecting the current Itest at time t4. Because the frequency variation $\Delta f$ of the VCO 17" is linearly proportional to capacitance variation caused by the varactor 141 and the capacitance variation caused by the varactor 141 is linear to the voltage variation on the varactor 141, the relationship between the frequency variation $\Delta f$ of the VCO 17" and the voltage variation on the varactor 141 can be regarded as $\Delta f = \Delta V \times K_{VCO}$. Accordingly, the output frequency fVCO is sharply increased to frequency f4 from f3 as the voltage VR is sharply increased to voltage V4 from V3 by the predetermined voltage variation $\Delta V$ at time t3. Then, after the predetermined time interval $\Delta t$ passes, the output frequency is decreased to frequency f3 from f4 as the voltage VR is sharply decreased to voltage V3 from V4 at time t4.

Figure 6B:
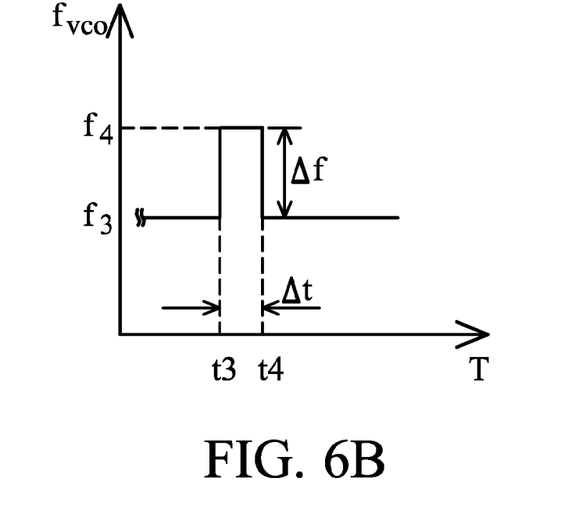
FIG. 6B is a diagram showing the frequency variation characterized by a delta function caused by the voltage variation shown in FIG. 6A.

Namely, the triggering unit 21A injects the test current Itest to the resistor R1 to induces the voltage variation $\Delta V$ characterized by the delta function on the voltage VR as shown in FIG. 6A, such that the LPCU 14 to induces the frequency variation $\Delta f$ characterized by the delta function in the output frequency fVCO as shown in FIG. 6B. The predetermined voltage variation $\Delta V$ characterized by the delta function induced by the test current Itest can be regard as a delta function pulse, and the amount of the predetermined voltage variation $\Delta V$ is simply the current value of the test current Itest times the resistance value of the resistor R1.

The phase error detector 22 compares a phase of the reference signal $S_{REF}$ and a phase of the divided oscillation signal $S_{FB}$ to obtain a phase error $\theta_e$ caused by the frequency variation $\Delta f$ characterized by the delta function. The phase error detector 22 converts the phase error $\theta_e$ caused by the frequency variation $\Delta f$ characterized by the delta function into a digital code $C_E$. The digital code $C_E$ is output to a control unit (not shown), and then the control unit calculates and calibrates the gain $K_{VCO}$ of the VCO 17" according to the digital code $C_E$ as discussed above. Because the spectrum of the frequency variation $\Delta f$ characterized by the delta function is a white-noise, the performance of the phase locked loop module 10" is not influenced by the frequency variation $\Delta f$ characterized by the delta function, and thus, the gain calibration module 20 can trigger the LPCU 14 to induce the frequency variation Δf characterized by the delta function in the output frequency $f_{VCO}$ and calculates the gain $K_{VCO}$ of the VCO 17" when the phase locked loop module 10" is operated under a closed loop.

Figure 7:
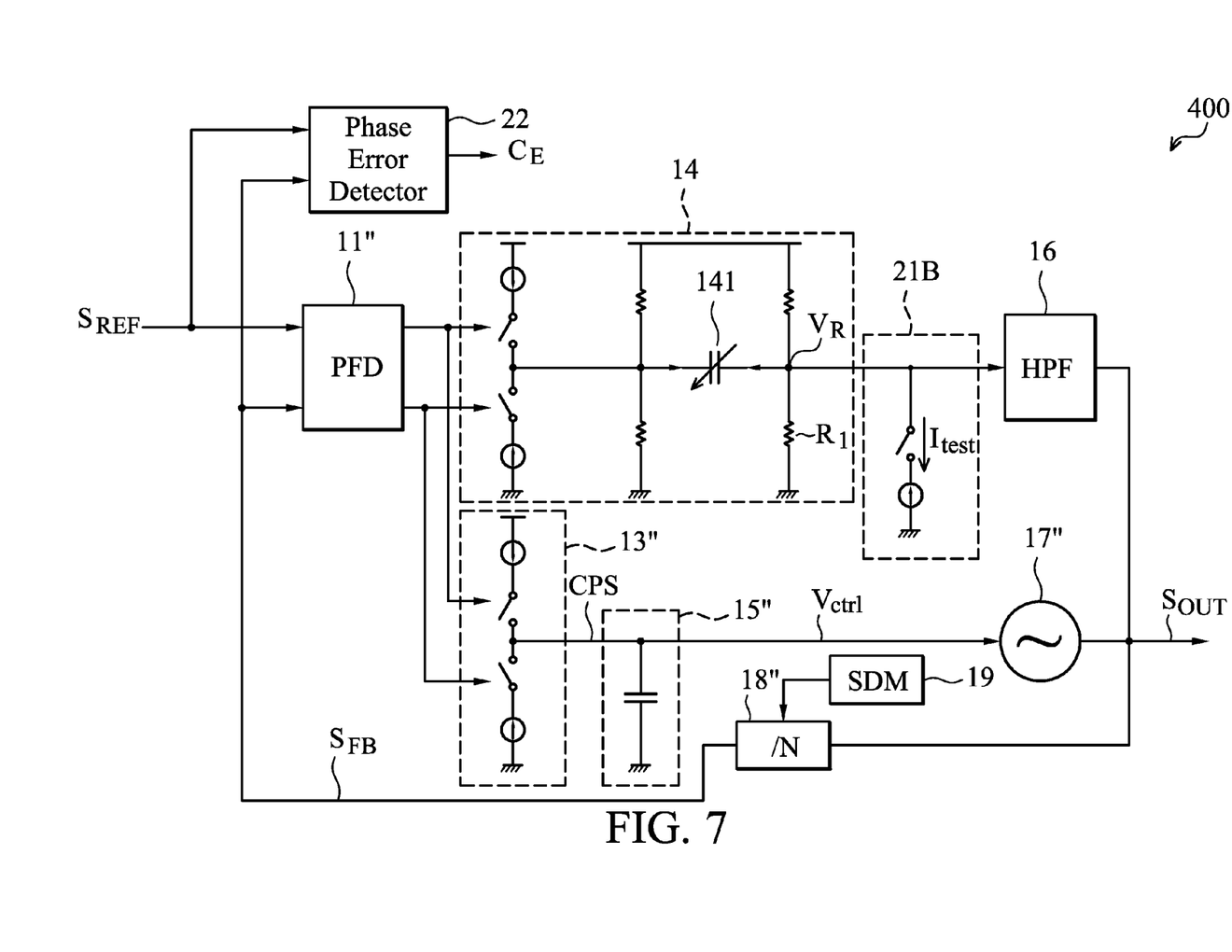
FIG. 7 shows another embodiment of a phase locked loop circuit.

FIG. 7 shows another embodiment of the phase locked loop circuit 400 differing from the phase locked loop circuit 300 shown in FIG. 5 in that the triggering unit 21B drains the test current $I_{test}$ from the LPCU 14 to induce the frequency variation Δf characterized by the delta function in the output frequency $f_{VCO}$ rather than injecting the test current $I_{test}$ to the LPCU 14. Operations of the phase locked loop circuit 400 are similar to that of the phase locked loop circuit 300, and thus, are omitted for brevity.

Figure 8:
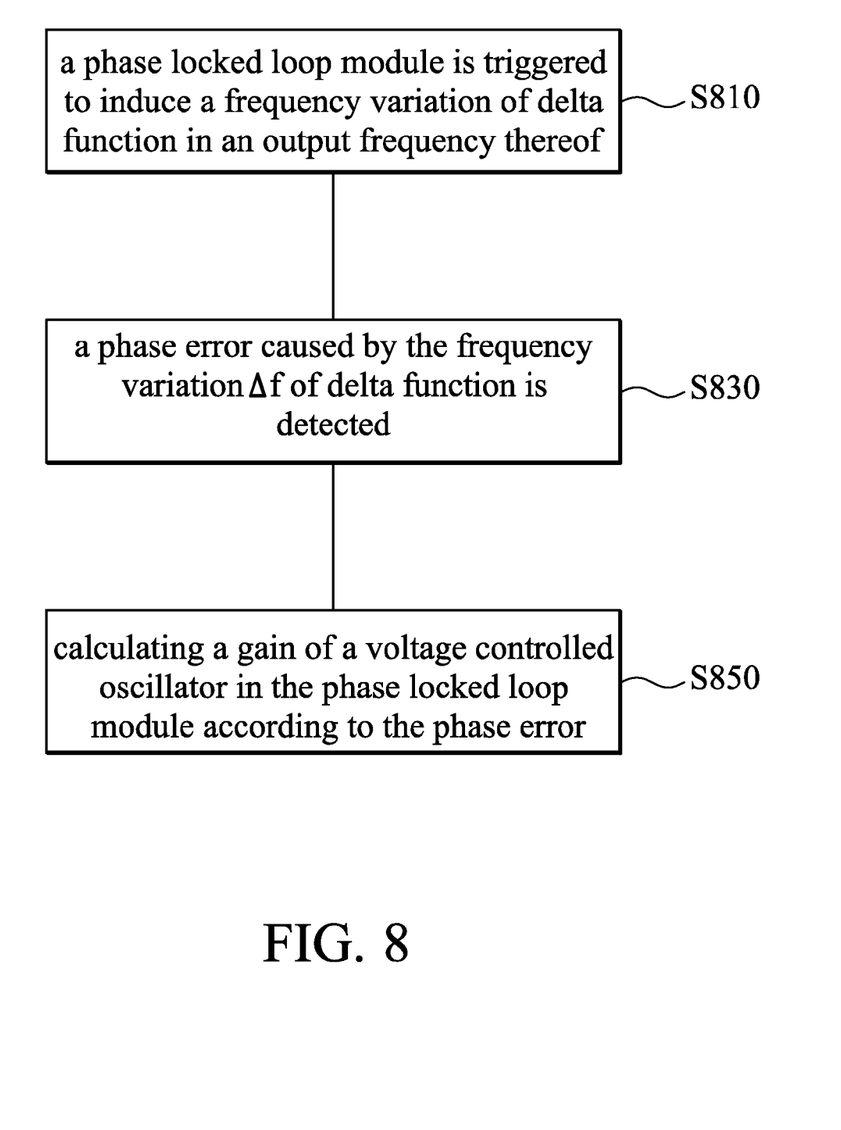
FIG. 8 shows a flowchart of a gain calibration method.

FIG. 8 shows a flowchart of a gain calibration method. In step S810, a phase locked loop module is triggered to induce a frequency variation Δf characterized by the delta function in an output frequency $f_{VCO}$ thereof. For example, the triggering unit 21 increases/decreases the control voltage $V_{ctrl}$ of the VCO 17 or 17" by a predetermined voltage variation ΔV for a predetermined time interval Δt, as shown in FIGS. 1 and 3. Due to Δf=ΔV×$K_{VCO}$, the output frequency $f_{VCO}$ is sharply increased/decreased to frequency $f_2$ from $f_1$ as the control voltage $V_{ctrl}$ is sharply increased/decreased to voltage $V_2$ from $V_1$ by the predetermined voltage variation ΔV at time $t_1$, as shown in FIG. 2A/2C. Then, after the predetermined time interval Δt passes, the output frequency is decreased/increased to frequency $f_1$ from $f_2$ as the control voltage $V_{ctrl}$ is sharply decreased/increased to voltage $V_1$ from $V_2$ at time $t_2$. It can be regarded as the triggering unit 21 applies a pulse characterized by a delta function as shown in FIG. 2A/2C to trigger the phase locked loop module 10 to induce the frequency variation Δf characterized by the delta function in the output frequency $f_{VCO}$ as shown in FIG. 2B/2D.

Alternatively, as shown in FIG. 5, the triggering unit 21A triggers the LPCU 14 in the phase locked loop module 10" to induce the frequency variation Δf characterized by the delta function in the output frequency fVCO. For example, the triggering unit 21A injects an accurate test current Itest mirrored from a band-gap reference with a ratio to the resistor R1 for a predetermined time interval Δt. Namely, the triggering unit 21A injects the test current Itest to the resistor R1 to induces the voltage variation ΔV characterized by the delta function on the voltage VR as shown in FIG. 6A. The predetermined voltage variation ΔV characterized by the delta function induced by the test current Itest can be regard as a delta function pulse, and the amount of the predetermined voltage variation ΔV is simply the current value of the test current Itest times the resistance value of the resistor R1. Because the frequency variation Δf of the VCO 17" is linearly proportional to capacitance variation caused by the varactor 141 and the capacitance variation caused by the varactor 141 is linear to the voltage variation on the varactor 141, the relationship between the frequency variation Δf of the VCO 17" and the voltage variation on the varactor 141 can be regarded as Δf=ΔV×$K_{VCO}$. Accordingly, the output frequency NCO is sharply increased to frequency f4 from f3 as the voltage VR is sharply increased to voltage V4 from V3 by the predetermined voltage variation ΔV at time t3. Then, after the predetermined time interval Δt passes, the output frequency is decreased to frequency f3 from f2 as the voltage VR is sharply decreased to voltage V3 from V4 at time t4.

In some embodiments, the triggering unit 21B can also drain the test current Itest from the LPCU 14 to induce the frequency variation Δf characterized by the delta function in the output frequency fVCO. It should be noted that the phase locked loop module is triggered to induce the frequency variation Δf characterized by the delta function in the output frequency fVCO when being operating under a closed loop form rather than an open loop form.

In step S830, a phase error caused by the frequency variation Δf characterized by a delta function is detected. As shown in FIGS. 1, 3. 5 and 7, the frequency divider 18 or 18" divides the oscillation signal SOUT with the frequency variation Δf characterized by the delta function in the output frequency $f_{VCO}$ to generate a divided oscillation signal $S_{FB}$. The phase error detector 22 then compares a phase of the divided oscillation signal $S_{FB}$ and that of the reference signal $S_{REF}$ to obtain a phase error caused by the frequency variation Δf characterized by the delta function. The phase error detector 22, for example, can be a time to digital converter, and thus, the phase error $θ_e$ caused by the frequency variation Δf characterized by the delta function is converted into a digital code $C_E$.

In step S850, the gain of the voltage controlled oscillator is calculated according to digital code. For example, the digital code $C_E$ generated by the phase error detector 22 is output to a control unit (not shown), and then the control unit calculates and calibrates the gain $K_{VCO}$ of the VCO according to the digital code $C_E$. For example, from $θ_e$=Δf×Δt and Δf=ΔV×$K_{VCO}$, the phase error $θ_e$ can be rewritten as $θ_e$=ΔV×$K_{VCO}$×Δt. In the embodiment, because the predetermined voltage variation ΔV and the predetermined time interval Δt are applied by the triggering unit 21 and the phase error $θ_e$ is measured by the phase error detector 22, the gain of the VCO 17 can be accurately calculated and calibrated. It should noted that because the spectrum of the frequency variation Δf characterized by the delta function is a white-noise, the performance of the phase locked loop module 10 is not influenced by the frequency variation Δf characterized by the delta function.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. A phase locked loop circuit, comprising:
 a phase locked loop module comprising a voltage controlled oscillator to generate an oscillation signal with an output frequency according to a control voltage; and
 a gain calibration module, triggering the phase locked loop module for a predetermined time interval to induce a phase variation characterized by a delta function in the output frequency, and calculating a gain of the voltage controlled oscillator according to the predetermined time interval and a phase error caused by the phase variation in the output frequency.

2. The phase locked loop circuit as claimed in claim 1, wherein the phase locked loop module further comprises a frequency divider dividing the oscillation signal with the phase variation and generating a divided oscillation signal, and the gain calibration module comprises a phase error detector generating a digital code representing the phase error caused by the phase variation according to the divided oscillation signal and a reference signal.

3. The phase locked loop circuit as claimed in claim 2, wherein the phase error detector is a time to digital converter.

4. The phase locked loop circuit as claimed in claim 2, wherein the gain calibration module calculates the gain of the voltage controlled oscillator according to the digital code.

5. The phase locked loop circuit as claimed in claim 1, wherein the gain calibration module increases/decreases the control voltage by a predetermined voltage for the predetermined time interval, such that the phase locked loop module induces the phase variation in the output frequency.

6. The phase locked loop circuit as claimed in claim 1, wherein the phase locked loop module further comprises a proportional path coupled to the voltage controlled oscillator, and the gain calibration module triggers a linear phase correction unit in the proportional path to induce the phase variation in the output frequency.

7. The phase locked loop circuit as claimed in claim 6, wherein the gain calibration module injects a predetermined current to the linear phase correction unit for the predetermined time interval, such that the phase locked loop module induces the phase variation characterized by the delta function.

8. The phase locked loop circuit as claimed in claim 6, wherein the gain calibration module drains a predetermined current from the linear phase correction unit for the predetermined time interval, such that the phase locked loop module induces the phase variation characterized by the delta function.

9. A phase locked loop circuit, comprising:
a phase locked loop module comprising a phase frequency detector, a charge pump circuit, a loop filter and a voltage controlled oscillator and generating an oscillation signal with an output frequency; and
a gain calibration module triggering the phase locked loop module for a predetermined time interval to induce a phase variation characterized by a delta function in the output frequency and calculating a gain of the voltage controlled oscillator according to the predetermined time interval and a phase error caused by the phase variation in the output frequency, when the phase locked loop module is operated under a closed loop.

10. The phase locked loop circuit as claimed in claim 9, wherein the gain calibration module applies a pulse to trigger the phase locked loop module to induce the phase variation characterized by the delta function in the output frequency.

11. The phase locked loop circuit as claimed in claim 9, wherein the phase locked loop module further comprises a proportional path coupled to the voltage controlled oscillator, and the gain calibration module applies a pulse to a linear phase correction unit in the proportional path, such that the phase locked loop module induces the phase variation characterized by the delta function.

12. A gain calibration method, comprising:
triggering a phase locked loop module for a predetermined time interval to induce a phase variation characterized by a delta function in the output frequency of an oscillation signal thereof;
detecting a phase error caused by the phase variation characterized by the delta function; and
calculating a gain of a voltage controlled oscillator in the phase locked loop module according to the phase error and the predetermined time interval.

13. The gain calibration method as claimed in claim 12, wherein the phase locked loop module is triggered to induce the phase variation characterized by the delta function in the output frequency when being operated in a closed loop.

14. The gain calibration method as claimed in claim 12, wherein the phase variation characterized by the delta function in the output frequency is induced by increasing/decreasing a control voltage of the voltage controlled oscillator by a predetermined voltage during the predetermined time interval.

15. The gain calibration method as claimed in claim 12, wherein the phase variation characterized by the delta function in the output frequency is induced by applying a pulse to trigger the voltage controlled oscillator.

16. The gain calibration method as claimed in claim 12, wherein the phase variation characterized by the delta function in the output frequency is induced by applying a pulse to a linear phase correction unit in the phase locked loop module.

17. The gain calibration method as claimed in claim 12, wherein the phase variation characterized by the delta function in the output frequency is induced by injecting a predetermined current to a linear phase correction unit in the phase locked loop module for the predetermined time interval.

18. The gain calibration method as claimed in claim 12, wherein the phase variation characterized by the delta function in the output frequency is induced by draining a predetermined current from a linear phase correction unit in the phase locked loop module for the predetermined time interval.

19. The gain calibration method as claimed in claim 12, wherein detecting the phase error comprises:
dividing the oscillation signal with the phase variation characterized by a delta function in the output frequency to generate a divided oscillation signal; and
comparing a phase of the divided oscillation signal and that of a reference signal to obtain a digital code representing the phase error.

20. The gain calibration method as claimed in claim 19, wherein the gain of the voltage controlled oscillator is calculated according to the digital code representing the phase error.

* * * * *